United States Patent [19]

Chennakeshu et al.

[11] Patent Number: 5,283,811
[45] Date of Patent: Feb. 1, 1994

[54] DECISION FEEDBACK EQUALIZATION FOR DIGITAL CELLULAR RADIO

[75] Inventors: Sandeep Chennakeshu, Clifton Park; Anand Narasimhan, Troy; John B. Anderson, Latham, all of N.Y.

[73] Assignee: General Electric Company, Schenectady, N.Y.

[21] Appl. No.: 754,105

[22] Filed: Sep. 3, 1991

[51] Int. Cl.⁵ .............................................. H03H 7/30
[52] U.S. Cl. .................................... 375/14; 364/724.2
[58] Field of Search ............................ 375/12, 13, 14; 364/724.2, 724.19; 333/28 R, 18

[56] References Cited

U.S. PATENT DOCUMENTS 4,852,090  7/1989  Borth ................................ 375/15 X
5,068,873  11/1991  Murakami ......................... 375/14 X

OTHER PUBLICATIONS

"Fractionally-Spaced Equalization: An Improved Digital Transversal Equalizer", R. D. Gitlin et al., The Bell System Technical Journal, vol. 60, No. 2 Feb. 1981 pp. 275-296.
"Sensitivity Analysis of Transversal RLS Algorithms with Correlated Inputs", S. Ardalan et al., IEEE Iternational Symposium on Circuits and Systems, Portland, Oreg., May 1989.
Adaptive Filter Theory, Chapter 8, Prentice Hall, Englewood Cliffs, N.J., 1986, S. Haykin.
"An Adaptive MLSE Receiver for TDMA Digital Mobile Radio", R. D'Avella, et al., IEEE, vol. 7, No. 1, Jan. 1989, pp. 122-129.
"Adaptive Lattice Decision-Feedback Equalizers--Their Performance and Application to Time-Variant Multipath Channels", IEEE Trans. Comm. vol. COM-33, No. 4, pp. 348-356. F. Ling et al.
"Application of Fast Kalman Estimation to Adaptive Equalization", D. Falconer et al., IEEE Transactions on Communications, vol. COM-26, No. 10, Oct. 1978, pp. 1439-1446.
"Adaptive Maximum-Likelihood Receiver for Carrier-Modulated Data-Transmission Systems", G. Underboeck, IEEE Transactions on Communications, vol. COM-22, No. 5, May 1974, pp. 624-636.
"Results on Fast-Kalman and Viterbi Adaptive Equalizers for Mobile Radio with CEPT/GSM System Characteristics", Proc. of IEEE Globecom., pp. 26.3.1-26.3.5., 1988.
"Bit Synchronization and Timing Sensitivity in Adaptive Viterbi Equalizers for Narrowband-TDMA Digital Mobile Systems", A. Baier et al., IEEE Vehicular Technology Conference, Philadelphia, Pa., pp. 377-384, 1988.
"Design and Performance of Synchronization Techniques and Viterbi Adaptive Equalizers for Narrowband TDMA Mobile Radio", G. D'Aria et al., 3rd Nordic Seminar on Digital Land Mobile Radio Comm., Copenhagen, Denmark, Sep. 13-15, 1988.
S. Chennakeshu et al., "Decision Feedback Equalization for Digital Cellular Radio", IEEE International Communications Conference, Atlanta, Ga., Apr. 1990, pp. 1492-1496.

Primary Examiner—Stephen Chin
Assistant Examiner—Tesfaldet Bocure
Attorney, Agent, or Firm—Marvin Snyder

[57] ABSTRACT

An adaptive Decision Feedback Equalizer (DFE) (40) for a digital cellular mobile radio channel demodulator (30) employs a Complex Fast-Kalman Adaptation algorithm (56) to track channel variations. Sensitivity to sample timing jitter is reduced by providing the DFE with fractionally spaced feed-forward taps (50'). Deficiencies inherent in using a reduced precision implementation are overcome by adding a dither signal to sets of operations in the algorithm, the dither signal comprising an appropriately selected Gaussian random variable. For small delay spreads of approximately one third of a symbol duration or less, a resulting degradation in Bit Error Rate is avoided by switching the DFE out of the circuit or by reducing the number of taps of the DFE. For delay spreads of less than 40 microseconds and greater than approximately 10 microseconds, a (2,3) fractionally spaced DFE provides an adequate compromise between complexity and performance.

12 Claims, 6 Drawing Sheets

DECISION FEEDBACK EQUALIZATION FOR DIGITAL CELLULAR RADIO

RELATED APPLICATIONS

This application is related to the following U.S. patent applications which are filed concurrently herewith and assigned to the present assignee:

H. Lester et al. Ser. No. 07/754,471, filed Sep. 3, 1991, "Automatic Simulcast Alignment";

S. Chennakeshu et al. Ser. No. 07/753,578, filed Sep. 3, 1991 "Adaptive MLSE-VA Receiver for Digital Cellular Radio";

S. Chennakeshu et al. Ser. No. 07/753,579, filed Sep. 3, 1991 "Order Recursive Lattice Decision Feedback Equalization for Digital Cellular Radio"; and R. Toy et al. Ser. No. 07/754,108, filed Sep. 3, 1991, "Frame/Slot Synchronization for U.S. Digital Cellular TDMA Radio Telephone System".

FIELD OF THE INVENTION

This invention relates generally to telecommunication method and apparatus and, in particular, to a demodulator for a digital cellular radio receiving including an adaptive Decision Feedback Equalizer (DFE), and a method for operating the demodulator. More specifically, a synchronous DFE and a fractionally spaced DFE are disclosed, both of which are adaptive and employ a complex fast recursive least squares algorithm to track rapid channel variations.

BACKGROUND OF THE INVENTION

A requirement for increased capacity in the U.S. cellular radio system has resulted in adoption of digital technology. The digital system employs Time Division Multiple Access (TDMA) as a channel access method in conjunction with a digital modulation scheme. A proposed IS-54 standard for digital cellular communication specifies a particular frame and slot structure. Under this standard, three to six users share a common 30 KHz radio frequency (RF) channel. Each user transmits data in an assigned time slot which is part of a larger frame. The gross bit rate of data transmitted over the channel is 48.6 Kbits/sec. The transmitted digital data is first mapped onto $\pi/4$-shifted Differentially encoded Quadrature Phase Shift Keying (DQPSK) symbols and then pulse shaped using a square root raised cosine filter. The pulse shaped signal is subsequently modulated onto an RF carrier.

Data transmission in this digital cellular system is adversely affected by multipath propagation which causes delay spread and consequent Inter-Symbol Interference (ISI), where a symbol is comprised of a pair of binary bits. Delay spreads exceeding one third of the symbol duration cause a significant increase in Bit Error Rate (BER), necessitating use of an equalizer in the receiver. Typical delay spreads encountered in urban and rural areas in the U.S. are less than 40 microseconds, implying a need for equalization of one symbol of interference for a data rate of 48.6 Kbits/sec. (One symbol of interference has a 40 microsecond duration.) Mobile receivers also experience rapid channel variations and Doppler-induced frequency shifts that are proportional to vehicle speed.

The channel impairments described above require that nonlinear adaptive equalizers be incorporated in cellular radios. Two suitable equalizers are the Decision Feedback Equalizer (DFE) and an equalizer based on Maximum Likelihood Sequence Estimation (MLSE). The MLSE method employs the well known Viterbi algorithm and is referred to in the art as a Viterbi Equalizer or an MLSE-VA equalizer.

Both the MLSE and DFE techniques have been researched in some detail for use in the European CEPT/GSM cellular radio system. Results of this research are reported by, for example, R. D'Avella et al. "An Adaptive MLSE Receiver for TDMA Digital Mobile Radio", IEEE Journal on Selected Areas in Communications, Vol. 7, No. 1, pp. 122-129, Jan. 1989, G. D'Aria et al. "Design and Performance of Synchronization Techniques and Viterbi Adaptive Equalizers for Narrowband TDMA Mobile Radio", proceedings of 3rd Nordic Seminar on Digital Land Mobile Radio Comm., Copenhagen, Denmark, September 13-15, and A. Baier et al., "Bit Synchronization and Timing Sensitivity in Adaptive Viterbi Equalizers for Narrowband TDMA Digital Mobile Radio Systems", proceedings of IEEE Vehicular Technology Conference, Philadelphia, pp. 372-382, 1988. The following two references also relate to DFE for the CEPT/GSM system: G. D'Aria et al., "Adaptive Baseband Equalizers for Narrowband TDMA/FDMA Mobile Radio", CSELT Technical Report, Vol. 16, No. 1, pp. 19-27, Feb. 1988; and G. D'Aria et al., "Results on Fast-Kalman Estimation to Adaptive Equalizers for Mobile Radio with CEPT/GSM System Characteristics", Proc. of IEEE Globecom, pp. 26.3.1-26.3.5, 1988.

The CEPT/GSM system is quite different from the system proposed for use in the U.S. in that it employs a narrower time slot, partial response modulation (GMSK), a wider bandwidth and a higher data rate (270.8 Kbits/sec.). The narrower time slot typically permits the channel to be treated as being time invariant while the wider bandwidth implies a reduced fade depth. Furthermore, the higher data rate results in increased ISI. As a result, the receiver equalization requirements of the European and the proposed U.S. cellular systems are different.

An MLSE-VA equalizer for use with the proposed US digital cellular system is disclosed by the present inventors S. Chennakeshu, A. Narasimhan and J. B. Anderson in copending and commonly assigned U.S. patent application Ser. No. 07/753,578, filed Sep. 3, 1991 entitled "Adaptive MSLE-VA Receiver for Digital Cellular Radio." This MLSE-VA technique is related to an approach described by G. Ungerboeck in "Adaptive Maximum Likelihood Receiver for Carrier Modulated Data Transmission Systems", IEEE Trans. Comm., Vol. COM-22, No. 5, pp. 624-636, May 1974, which is incorporated herein by reference. The novel modifications made to this receiver, to render it operational in the mobile channel, include: splitting the front-end matched filter into (a) a fixed transversal filter that is matched to the transmitted signal pulse shape and (b) into an adaptive transversal filter that uses a Complex Fast-Kalman Algorithm to obtain an initial estimate of the channel. The adaptive transversal filter employs a newly derived normalized least mean square (NLMS) algorithm for signal element updates and for relating an adaptation rate to the decision depth of the Viterbi algorithm. The Complex Fast-Kalman Algorithm described therein is an extension of the type taught by D. Falconer et al. in "Application of Fast Kalman Estimation to Adaptive Equalization", IEEE Trans. Comm. Vol. Com-26, No. 10, pp. 1439-1446, October 1978, which is incorporated herein by reference. The novel extensions made to Falconer's technique provide for use with complex input data and without requiring matrix inversions.

Another MLSE demodulation approach, incorporated herein by reference, is described by G. D. Forney in "Maximum Likelihood Sequence Estimation of Digital Sequences in the Presence of Intersymbol Interference", IEEE Trans. Info. Theory, Vol. IT-18, pp. 363-378, May 1972. Forney's approach uses the Viterbi algorithm with a squared metric that is based on an assumption that the additive noise in the received signal, at the input to the maximum likelihood sequence estimator, is white and Gaussian. This is accomplished through use of a whitening filter at the input of the maximum likelihood sequence estimator.

Another equalization technique employs an equalizer based on a lattice structure and is disclosed by the present inventors S. Chennakeshu, A. Narasimhan and J. B. Anderson in copending and commonly assigned U.S. patent application Ser. No. 07/753,579, filed Sep. 3, 1991 entitled "Order Recursive Lattice Decision Feedback Equalization For Digital Cellular Radio." This DFE method employs a Least Squares (LS) adaptive algorithm of a type described in the article entitled "Adaptive Lattice Decision-Feedback Equalizers—Their Performance and Application to Time Variant Multipath Channels", by F. Ling and J. G. Proakis, in IEEE Trans. Comm., Vol. COM-33, No. 4, pp. 348-356, April 1985, which is incorporated herein by reference. The lattice DFE is enhanced to make it order recursive through the addition of a stage reduction algorithm.

R. D. Gitlin et al. in an article entitled "Fractionally-Spaced Equalization: An Improved Digital Transversal Filter", Bell System Technical Journal, Vol. 60, No. 2, pp. 275-296, Feb. 1981 describe the use of a fractionally spaced feedforward section of a transversal filter-based DFE to reduce sensitivity to sampling jitter. However, this discussion, incorporated herein by reference, is in the context of microwave and satellite channels and not in the context of a digital cellular radio.

It is thus an object of the invention to provide an improved DFE receiver for a digital cellular radio system that includes digital, mobile and digital trunked radio systems.

Another object of the invention is to provide an adaptive DFE receiver for a digital cellular radio system that is suitable for use with the proposed U.S. cellular radio signal standard.

SUMMARY OF THE INVENTION

The foregoing problems are overcome and the objects of the invention are realized by method and apparatus providing a demodulator for a digital cellular radio receiver that includes an adaptive DFE. Two DFE configurations are disclosed, a synchronous DFE and a fractionally spaced DFE. Both DFE techniques are adaptive and both employ a fast recursive least squares (LS) algorithm to track rapid channel variations.

In greater detail the invention contemplates method and apparatus for providing a DFE for a digital cellular mobile radio channel demodulator that employs a Complex Fast-Kalman Adaptation Algorithm to accurately track channel variations. The sensitivity to sample timing jitter is reduced by implementing the DFE with an adaptive filter having fractionally spaced feed-forward taps. Deficiencies inherent in the use of a reduced precision implementation of the algorithm are overcome by adding an appropriately selected Gaussian random variable as a dither signal to predetermined computations in the algorithm. For small delay spreads of approximately one third of a symbol duration, or less, a resulting degradation in Bit Error Rate is avoided by switching the DFE out of the circuit or by reducing the number of taps on the DFE. For delay spreads of less than 40 microseconds and greater than approximately 10 microseconds the use of a (2,3) fractionally spaced DFE provides good performance.

The invention further contemplates method and apparatus for demodulating a Time Division Multiple Access (TDMA) signal having a time slot comprised of a plurality of symbols, including at least one sequence of synchronizing symbols and a plurality of data symbols. The apparatus includes a receiver for receiving a signal over a channel and an adaptive filter for processing the received signal to minimize inter-symbol interference resulting from channel multipath propagation. An input of the adaptive filter is coupled to an output of the receiver and includes a decision feedback equalizer having a plurality n of feed-forward taps and a plurality m of feedback taps. The feed-forward taps are fractionally spaced to reduce susceptibility to sampling jitter and impairments produced by front-end filters. Preferably, n=2 and m=3. Each of the taps is coupled to a respective node for modifying the output signal in accordance with the value of an associated coefficient. The apparatus further provides the function of recursively generating the coefficients in accordance with a Complex Fast-Kalman Adaptation Algorithm.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE INVENTION

Figure 1:
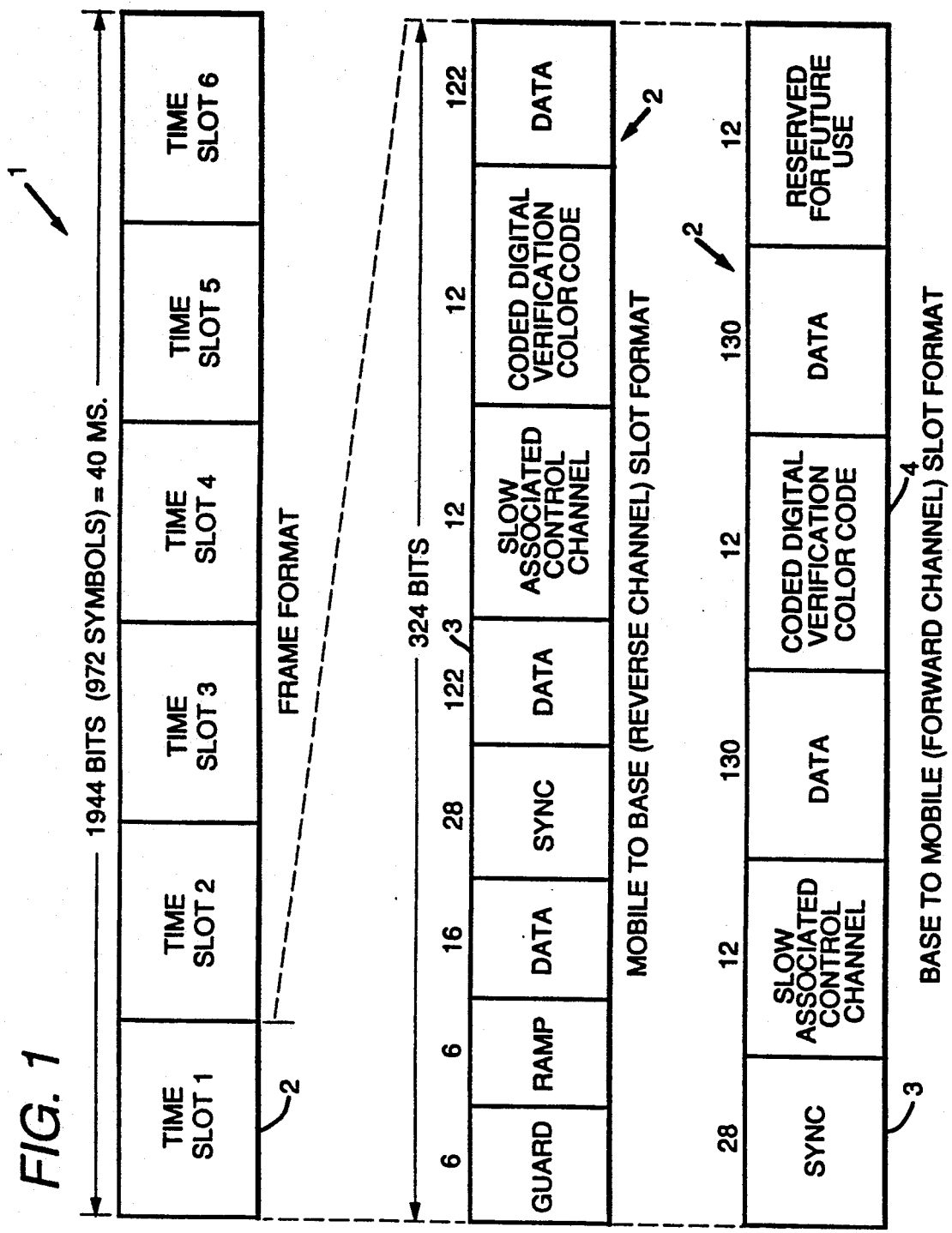
FIG. 1 illustrates the IS-54 proposed TDMA frame and slot structure.

The frame and slot structure for the proposed IS-54 standard for digital cellular communication is illustrated in FIG. 1. Under this standard, three to six users share a common 30 KHz RF channel. Each user transmits or receives data in an assigned time slot 2 of 324 bits duration within a larger (six slot) frame 1 of 40 milliseconds duration. The gross bit rate of data transmitted over the channel is 48.6 Kbits/sec.

Figure 2:
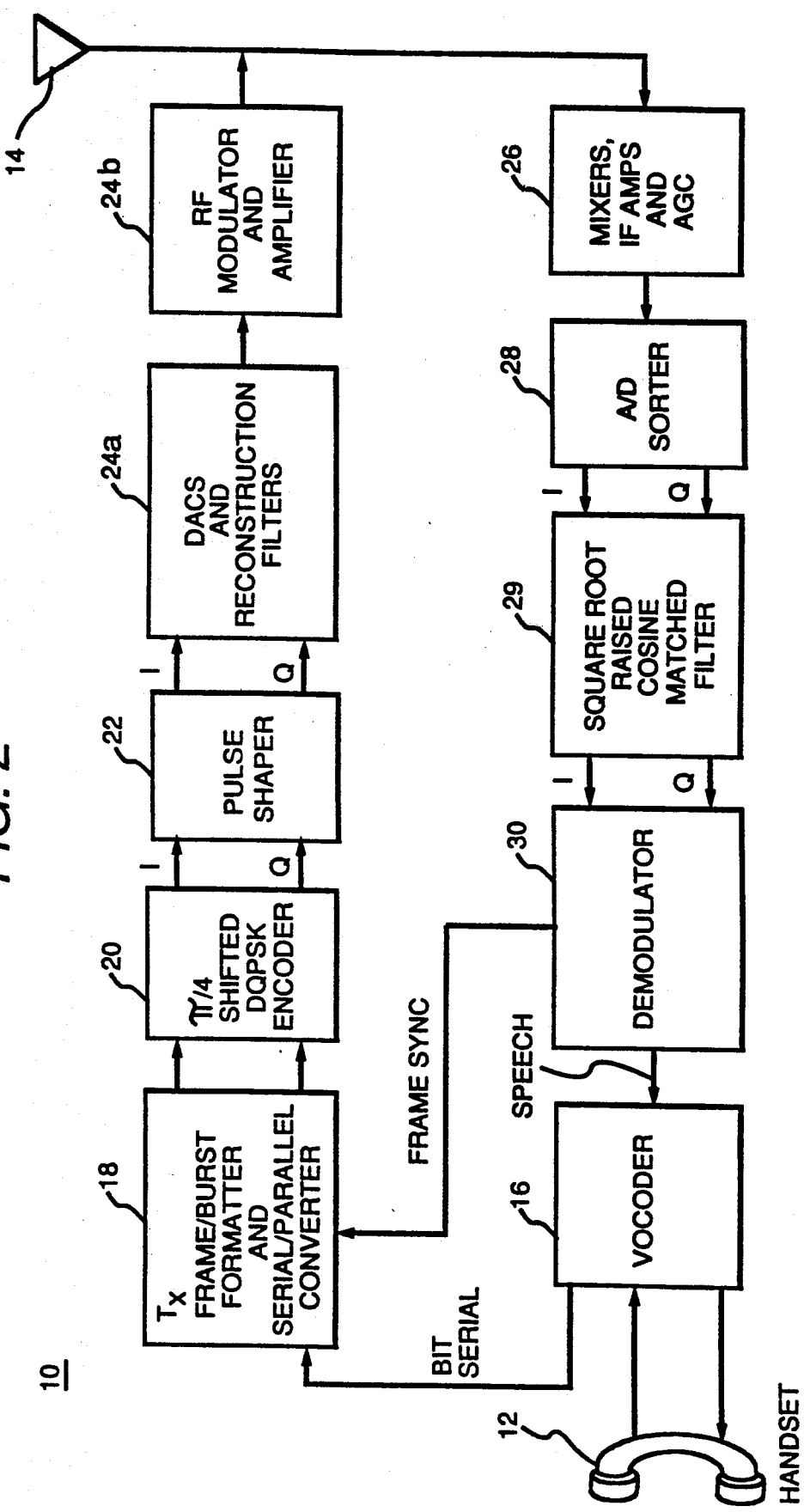
FIG. 2 is a simplified block diagram of a digital cellular radio telephone system that is constructed and operated in accordance with the invention.

FIG. 2 is a block diagram of a digital cellular radio system 10 incorporating the invention. System 10 includes a transmitter section and a receiver section. A handset 12 inputs and outputs audio information and an antenna 14 transmits an 824-849 MHz modulated RF carrier signal and receives an 869-894 MHz modulated RF signal. Each RF signal is transmitted in a channel having a bandwidth equal to 30 KHz. The system 10 may be installed within a motor vehicle and function as a mobile telephone. Alternatively, system 10 may be constructed for use as a hand held or portable radio unit that can be carried by a user (e.g., in a back-pack). A base station system may also be constructed of apparatus substantially as shown.

A vocoder 16 coupled to handset 12 includes an analog-to-digital (A/D) converter (not shown) for converting audio signals from the handset 12 microphone to a digital bit serial pulse stream. Output bits from vocoder 16 are supplied to a transmitter (Tx) frame/burst formatter 18 wherein the digital data are formatted and converted to parallel form for application to a pi/4-Shifted-DQPSK encoder 20. In-phase (I) and quadrature (Q) component output signals of encoder 20 are applied to a Nyquist square root raised cosine pulse shaper 22. Formatter 18, encoder 20 and pulse shaper 22 function as a digital modulator. The pulse shaped I and Q output signals of shaper 22 are applied to analog signal reconstruction circuitry 24a that includes digital-to-analog (D/A) converters and reconstruction filters for converting the shaped I and Q input digital information to analog signals for modulating the RF carrier. The modulated RF carrier, produced by an RF modulator and amplifier 24b, is amplified and then transmitted from an antenna 14.

Vocoder 16 receives a digital pulse stream input from the receiver circuitry and includes a D/A converter (not shown) for converting this pulse stream to an analog speech signal for driving a handset 12 speaker. The receiver circuitry includes RF and intermediate frequency (IF) stage 26 employing frequency mixers, IF amplifiers and an Automatic Gain Control (AGC) circuit. A high speed A/D converter circuit 28 includes, preferably, a flash A/D converter for converting the received signal to digital form, and a sorter for separating the converted signal into I and Q components which are supplied to a square root raised cosine filter 29 that is matched to the transmitter pulse shaper 22. Output signals of the matched filter 29 are fed to a baseband data demodulator 30. Demodulator 30 processes the I and Q received signals to extract the speech information that is input to the vocoder 16.

Another task of demodulator 30 is to process the incoming bit stream to achieve and maintain frame/slot synchronization. This function is preferably accomplished in accordance with the method and apparatus described in copending and commonly assigned U.S. patent application Ser. No. 07/754,108, filed Sep. 3, 1991 S. Chennakeshu and R. Toy, entitled "Frame/Slot Synchronization For U.S. Digital Cellular Radio Telephone System." The frame/slot information is also provided to frame/burst formatter 18 for use in synchronizing the transmitted information with the frame/slot timing.

Figure 3:
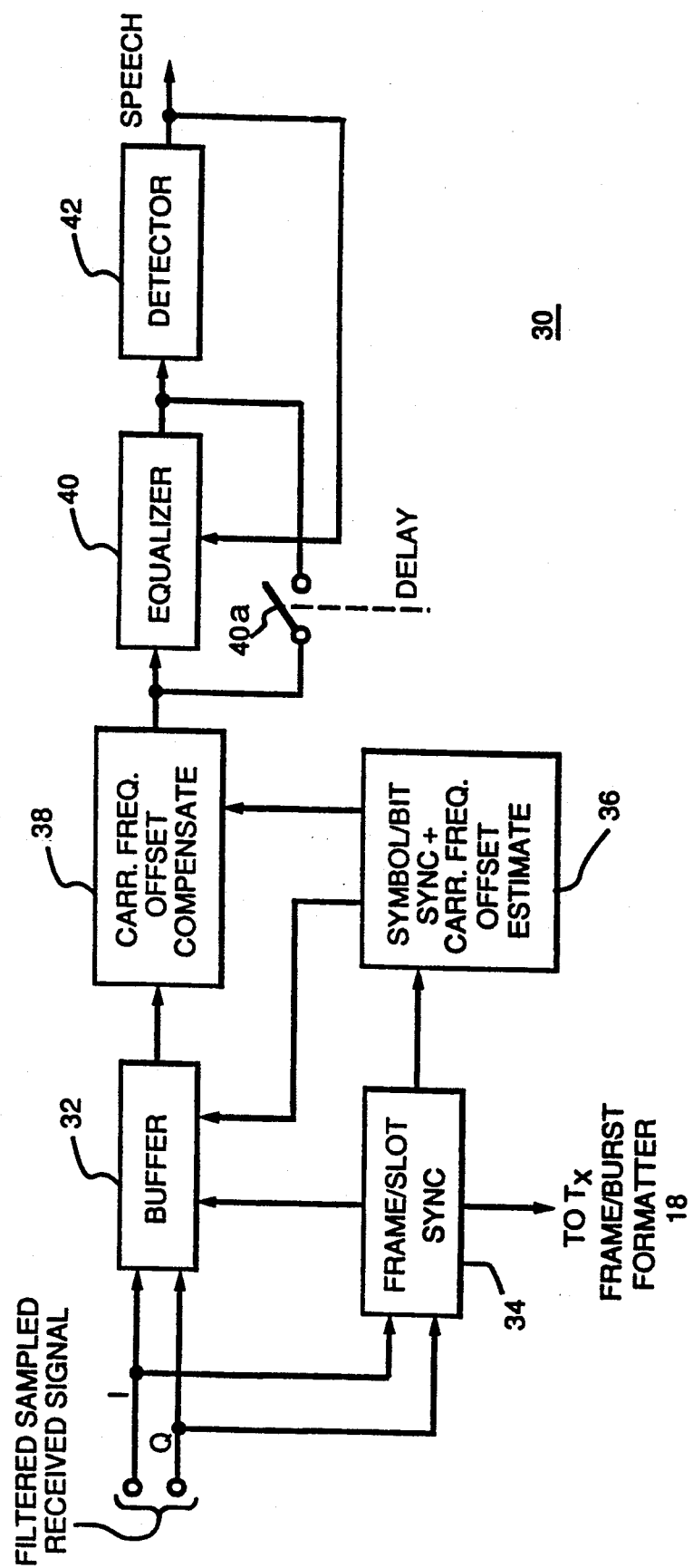
FIG. 3 is a block diagram that illustrates in greater detail the demodulator of FIG. 2.

As shown in greater detail in FIG. 3, demodulator 30 includes an input buffer 32 and a frame/slot synchronizer 34, each of which receives the I and Q digital data provided by the A/D and sorter 28 via filter 29. Further components of demodulator 30 process the input data to perform carrier frequency error compensation (block 38), symbol timing adjustment (block 36), equalization (block 40) and detection (block 42). Equalizer 40 is essential when delay spreads exceed a third of the symbol period, or approximately 14 microseconds for the U.S. digital cellular system. For those geographical areas where the delay spread is less than 14 microseconds, equalizer 40 may not be required. For such application, switch 40a is closed, to shunt the equalizer out of the circuit. For those applications that require equalizer 40, switch 40a is open so that the adaptive DFE approach described in detail below can be employed. For either demodulator 30 embodiment, i.e., with or without equalizer 40, the frame/slot synchronization, symbol timing and carrier frequency error compensation functions are performed identically.

System 10 of FIG. 2 may be implemented in any one of a number of suitable embodiments including discrete components, digital signal processors and combinations thereof. In a presently preferred embodiment of the invention, vocoder 16 and the digital modulator, including formatter 18, encoder 20 and pulse shaper 22, are each implemented with a digital signal processor of the type known as TMS320C25, while demodulator 30 is implemented with a digital signal processor of the type known as TMS320C30. The TMS320-type digital signal processors, including application and programming information, are available from Texas Instruments, Incorporated. The invention, however, is not to be construed as being limited to any one specific hardware or software embodiment.

Figure 4:
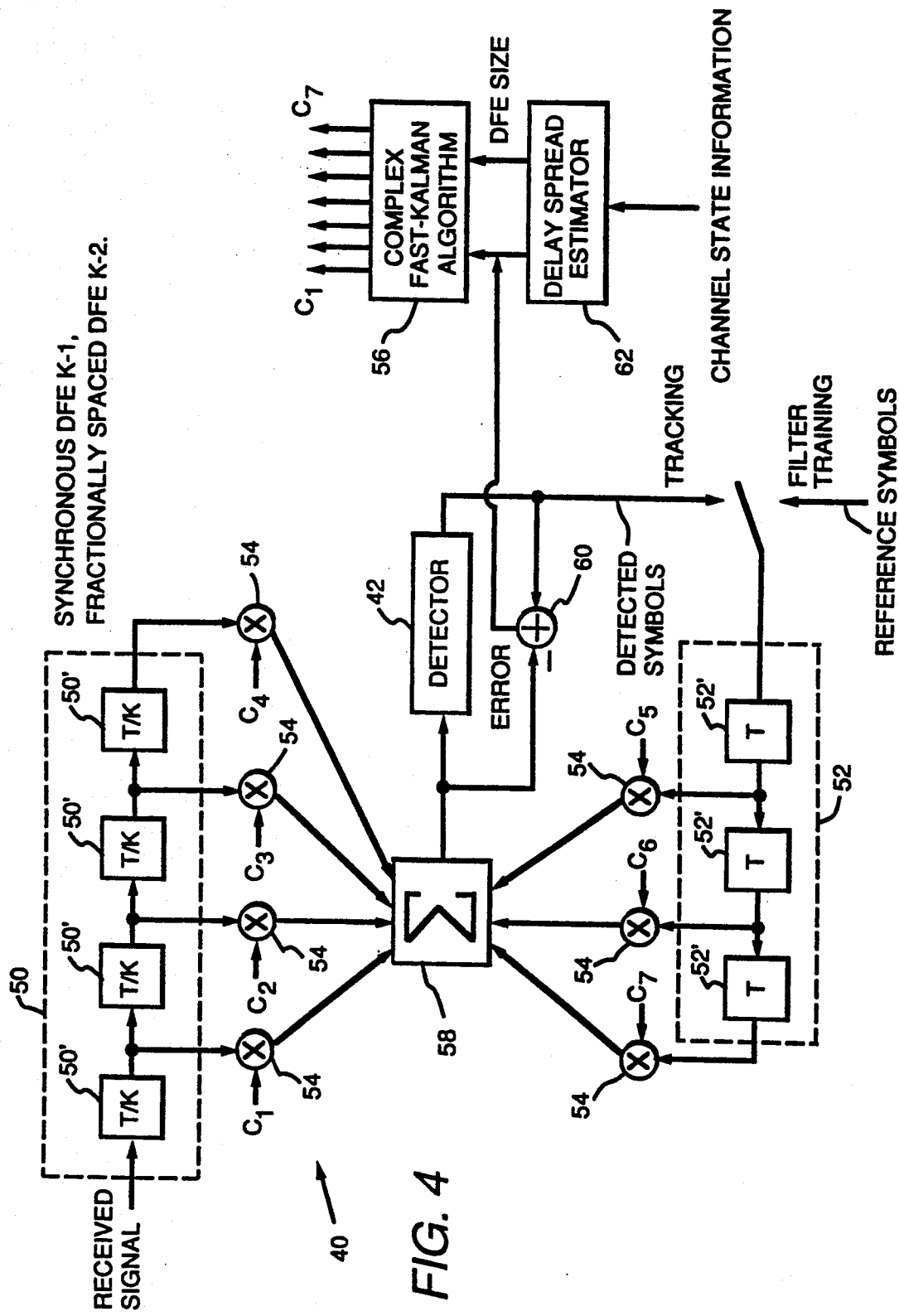
FIG. 4 is a block diagram illustrating a DFE embodiment having two transversal filters, including a feedforward and a feedback section.

FIG. 4 illustrates, in greater detail, equalizer 40 of FIG. 3, used in conjunction with the adaptive DFE demodulator 30 embodiment. The equalizer includes a feed-forward transversal filter 50 and a feedback transversal filter 52. The input signal to feed-forward filter 50 comprises received data that has been down-converted to baseband. The input to feedback filter 52 is switchably coupled to a known sequence of reference symbols, corresponding to the preamble (i.e., the 28 sync bits 3 of FIG. 1), during a filter training mode, and to detected symbols during a tracking mode. The feed-forward filter 50 compensates for ISI (precursors) arising from multipath propagation delays. The feedback filter 52 is ideally fed with correct detected symbols and thereby serves to remove the ISI due to previous symbols.

In accordance with a synchronous DFE embodiment of the invention the feed-forward filter 50 has filter taps (T) 50' spaced at distances of a symbol period (K=1), each tap 50' thus being designated T/K. In the fractionally spaced DFE embodiment of the invention the feed-forward taps 50' are spaced at one half of a symbol period (K=2). Other fractional spacings, such as $\frac{1}{3}$, $\frac{1}{4}$, etc. may also be employed. In both embodiments the feedback filter 52 taps 52' are placed at spacings of a full symbol period and are designated T. An advantage of employing a fractionally spaced DFE, of the form shown in FIG. 4, is that equalization of the spectrum outside of the Nyquist bandwidth is achieved. This makes the fractionally spaced DFE embodiment less sensitive, relative to the synchronous DFE embodiment, to sample timing phase, and to amplitude and phase impairments produced from front-end filters.

DFE 40 further includes a plurality of multiplying nodes 54 having as inputs an output of one of the filter taps (50, 52) and also an associated coefficient ($C_n$) generated by a Complex Fast-Kalman Algorithm functional block 56. The multiplying nodes feed a summation circuit 58 having an output coupled to detector 42. The output of detector 42 is switchably coupled to the input of feedback filter 52 during a tracking mode of operation to provide detected symbols thereto. During the training mode of operation, feedback filter 52 is fed with reference symbols corresponding to the preamble sequence or any other preassigned known sequence. An error generating node 60 subtracts the input signal to detector 42 from the output signal thereof and generates an error signal that is provided to both a Complex Fast-Kalman Algorithm functional block 56 and also to a Delay Spread Estimator 62. The operation and interaction of these various functional blocks is described in greater detail below.

During the training mode, DFE 40 sets the filter coefficients to an optimum value, but does not decode symbols. In the tracking mode, DFE 40 decodes the symbols and follows variations in the channel by adjusting the filter coefficients.

In the training mode, the DFE 40 coefficients could be set to an optimum value either by solving a set of linear equations, as indicated by M. K. Gurcan et al., "Assessment of Equalization Algorithm for Dispersive Channels", Land Mobile Radio, Fourth International Conference, Coventry, UK, pp. 81-86, Dec. 1987, and incorporated herein by reference, or by means of a recursive algorithm. The former technique, however, requires knowledge of the duration of the channel impulse response, signal and noise variance and is therefore not practical in many applications. The recursive algorithm, on the other hand, adjusts the coefficients iteratively with the objective of minimizing the mean square error (MSE) between a known data sequence, such as preamble 3 of FIG. 1, and the output signal of equalizer 40.

An equivalent, but more readily implemented, criterion that is used for iterative algorithms is the least squares (LS) criterion. The LS criterion is described by M. K. Gurcan et al. in the above mentioned article and also by S. Haykin, Adaptive Filter Theory, Chapter 8, Prentice Hall, Englewood Cliffs, NJ, 1986, incorporated herein by reference.

For a transversal filter-type DFE, generally two different types of recursive algorithms may be employed. These include gradient algorithms, such as Least Mean Squares (LMS) and Normalized Least Mean Squares (NLMS), and recursive least squares (RLS), or Kalman-type algorithms. The LMS algorithms exhibit slow convergence to optimum coefficient values, and are sensitive to the eigenvalue spread of the channel. However, the LMS algorithms are relatively simple to implement.

The RLS type algorithms exhibit fast convergence and are insensitive to the channel eigenvalue spread. However, these algorithms are complex to implement. The complexity is measured in terms of multiplication and additions in the recursions. The RLS algorithms exhibit a complexity on the order of $N^2$, where N is the total number of DFE coefficients. This complexity can be reduced by using a class of fast recursive least squares (FRLS) algorithms, which are mathematically equivalent to the RLS algorithms but have a complexity proportional to N. However, the FRLS category of algorithms exhibit a sensitivity to round-off errors.

As such, and in accordance with an aspect of the invention, a Complex Fast-Kalman algorithm is employed. The algorithm is based on an algorithm described by D. Falconer et al. in "Application of Fast-Kalman Estimation to Adaptive Equalization", IEEE Trans. Comm. Vol. COM-26, No. 10, pp. 1439-1466, October. 1978. The preferred algorithm, however, is extended to a complex form that does not require matrix inversions. The Complex Fast-Kalman Algorithm of the invention is implemented in the functional block 56 of FIG. 4 and is applied to the real time demodulation of digital cellular data.

Definitions are set forth below to aid in an understanding of the operation of functional block 56 and, for a transversal filter equalizer, p is set to 1; a symbol rate DFE, where p is set to 2; and a fractionally spaced DFE, where p is set to 3:

i) $F_{Np}(n)$: $N \times p$ matrix of forward predictor coefficients with $F_{Np}(0) = 0_{Np}$;

ii) $B_{Np}(n)$: $N \times p$ matrix of backward predictor coefficients with $B_{Np}(0) = 0_{Np}$;

iii) $E_{pp}(n)$: $p \times p$ matrix with $E_{pp}(0) = \delta^{-1} I_{pp}$ where $I_{pp}$ is an identity matrix and $\delta$ is chosen to be a small positive number, and where $\delta$ is found to be an estimate of the final mean square error;

iv) $K_N(n)$: N-dimensional Kalman gain vector with $K_N(0) = K_N(1) = 0$;

v) $K_M^e(n)$: $M = N + p$ extended Kalman gain vector;

vi) $\epsilon_p(n|n-1)$, $\epsilon_p(n|n)$: p-dimensional forward prediction error vectors;

vii) $V_p(n|n-1)$ p-dimensional backward prediction error vector;

viii) $\mu_p(n)$: p-dimensional vector obtained by partitioning $K_M^e(n)$;

ix) $M_N(n)$: N-dimensional vector obtained by partitioning $K_M^e(n)$;

x) $C_N(n)$: N-dimensional vector of equalizer coefficients; and xi) $\lambda$: a "forgetting" parameter chosen to be typically between 0.9-1.0.

Data Vectors are described below in accordance with the following.

i) $y(n)$ corresponds to received data samples. Samples are taken at the symbol rate for the synchronous DFE and at twice the symbol rate for the fractionally spaced DFE, with taps spaced one half of a symbol apart.

ii) $s(n) = I(n)$, where $I(n)$ denotes preamble 3 (of FIG. 1) data samples corresponding to the training mode; and $s(n) = d(n)$, where $d(n)$ denotes detected data samples corresponding to the tracking mode.

iii) $X_N(n) = [y(n-1) \ldots y(n-N_1) | s(n-2) \ldots s(n-N_2-1)]^T$; where T denotes transpose and $N = N_1 + N_2$. $N_1$ represents the number of feed-forward taps 50', while $N_2$ represents the number of feedback taps 52'.

iv) $\eta_p(n) = [y(n) | s(n)]^T$.

v) $\rho_p(n) = [y(n-N_1) | s(n-N_2-1)]^T$.

In accordance with the foregoing definitions the Complex Fast-Kalman Algorithm block 56 operates as described below. Starting at $n = 1$ the computations are carried out in the following order:

$$\epsilon_p(n|n-1) = \eta_p(n) - F_{Np}^H(n-1)X_N(n) \quad (1)$$

$$F_{Np}(n) = F_{Np}(n-1) + K_N(n)\epsilon_p^H(n|n-1) \quad (2)$$

$$\epsilon_p(n|n) = \eta_p(n) - F_{Np}^H(n)X_N(n) \quad (3)$$

$$E_{pp}(n) = G_{pp}(n-1) - \frac{G_{pp}(n-1)\epsilon_p(n|n)\epsilon_p^H(n|n-1)G_{pp}(n-1)}{1 + \epsilon_p^H(n|n-1)G_{pp}(n-1)\epsilon_p(n|n)} \quad (4)$$

-continued where $G_{pp}(n-1) = \frac{1}{\lambda} \cdot E_{pp}(n-1)$ $$K_M{}^f(n) = \left[ \frac{E_{pp}(n)\epsilon_p(n|n)}{K_N(n) - F_{Np}(n)E_{pp}(n)\epsilon_p(n|n)} \right] \quad (5)$$

$$K_M(n) = \left[ \frac{M_N(n)}{\mu_p(n)} \right] \quad (6)$$

$$V_p(n|n-1) = \rho_p - (n) - B_{Np}^H(n-1) X_N(n+1) \quad (7)$$

$$B_{Np}(n) = [B_{Np}(n-1) + M_N(n)v^H(n|n-1]D_{pp}(n) \quad (8)$$

where $D_{pp}(n) = \left[ I_{pp} - \frac{\mu_p(n)\, v_p{}^H(n|n-1)}{1 + V_p{}^H(n|n-1)\mu_p(n)} \right]$ where $I_{pp}$ is the p×p identity matrix $$K_N(n+1) = M_N(n) + B_{Np}(n)\mu_p(n) \quad (9)$$

$$e(n) = I(n-1) - C_N{}^H(n-1)X_N(n) \quad (10)$$

where $X_N(n)$ is defined for the training mode and H denotes conjugate transpose $$e(n) = d(n-1) - C_N{}^H(n-1)X_N(n) \quad (11)$$

where $X_N(n)$ is defined for the tracking mode, and $$C_N(n) = C_N(n-1) + K_N(n)e^*(n) \quad (12)$$

where * denotes conjugate.

The operation of the Complex Fast-Kalman Algorithm block 56, as described above, has been found to exhibit divergence when implemented with single precision floating point arithmetic using a 23 bit mantissa. In practice the DFE 40 is implemented in a Digital Signal Processor (DSP) with at most single precision floating point arithmetic.

A technique adapted for use in the system of FIG. 1, that allows a reduced precision implementation through the use of a uniformly distributed dither signal, is described by S. H. Ardalan et al. in "Sensitivity Analysis of Transversal RLS Algorithms with Correlated Inputs", IEEE International Symposium on Circuits and Systems, Portland, Oreg., May 1989, which is incorporated herein by reference. The principle of this method is described below.

The round-off error occurring from the use of reduced precision for multiplication or addition depends on the number of bits used to represent the mantissa. This round-off error can be modelled as additive noise having a uniform distribution with zero mean and a variance of $$\frac{2^{-2B_f}}{12};$$

where $B_f$ represents the number of bits in the mantissa. If an error sample $\xi$ is drawn from this distribution and subtracted from a reduced precision operation, the result will correspond to an ideal arithmetic operation. This process can be represented, for single precision arithmetic, as follows:

MULTIPLY: $XY$=SINGLE PRECISION $[XY]-\xi$

ADDITION: $X+Y$=SINGLE PRECISION $[X+Y]-\xi$

The error sample ($\xi$) is referred to as the dither signal and the process is called dithering. It can be seen that since every single precision arithmetic operation requires the addition of a dither signal the computational complexity increases.

To decrease the number of additions of the dither signal the technique of the invention employs the following technique. Instead of adding a uniform random variable after each arithmetic operation there is added a single Gaussian random variable after a set of operations. This technique follows directly from the central limit theorem. For example, consider the set of operations represented by Equation 1 in the previously described Complex Fast-Kalman Algorithm. Assuming p=1 and N=5 this set of operations requires five complex multiplications and one complex addition. This would require, in accordance with conventional practice, the addition of 34 uniform random variables. Instead, and in accordance with this aspect of the invention, all of the operations are performed first and then there is added one complex Gaussian random variable of zero mean and having a variance equal to 34×

$$\frac{2^{-2B_f}}{12}.$$

It is noted that this addition is done for each equation in the Complex Fast-Kalman Algorithm block 56. It has also been found that the addition of the dither signal can be made selectively at only those equations in the algorithm block 56 that are found to be sensitive to round-off error, thereby reducing computational complexity even further.

In an evaluation of the performance of the invention disclosed herein it is assumed that symbol timing recovery is perfect and that there is no carrier frequency offset. However, under actual field conditions these two impairments seriously degrade performance of the DFE 40. Therefore, and in accordance with a further aspect of the invention, there is now described method and apparatus to obtain the correct symbol timing and to adjust for a carrier frequency offset.

Figure 5:
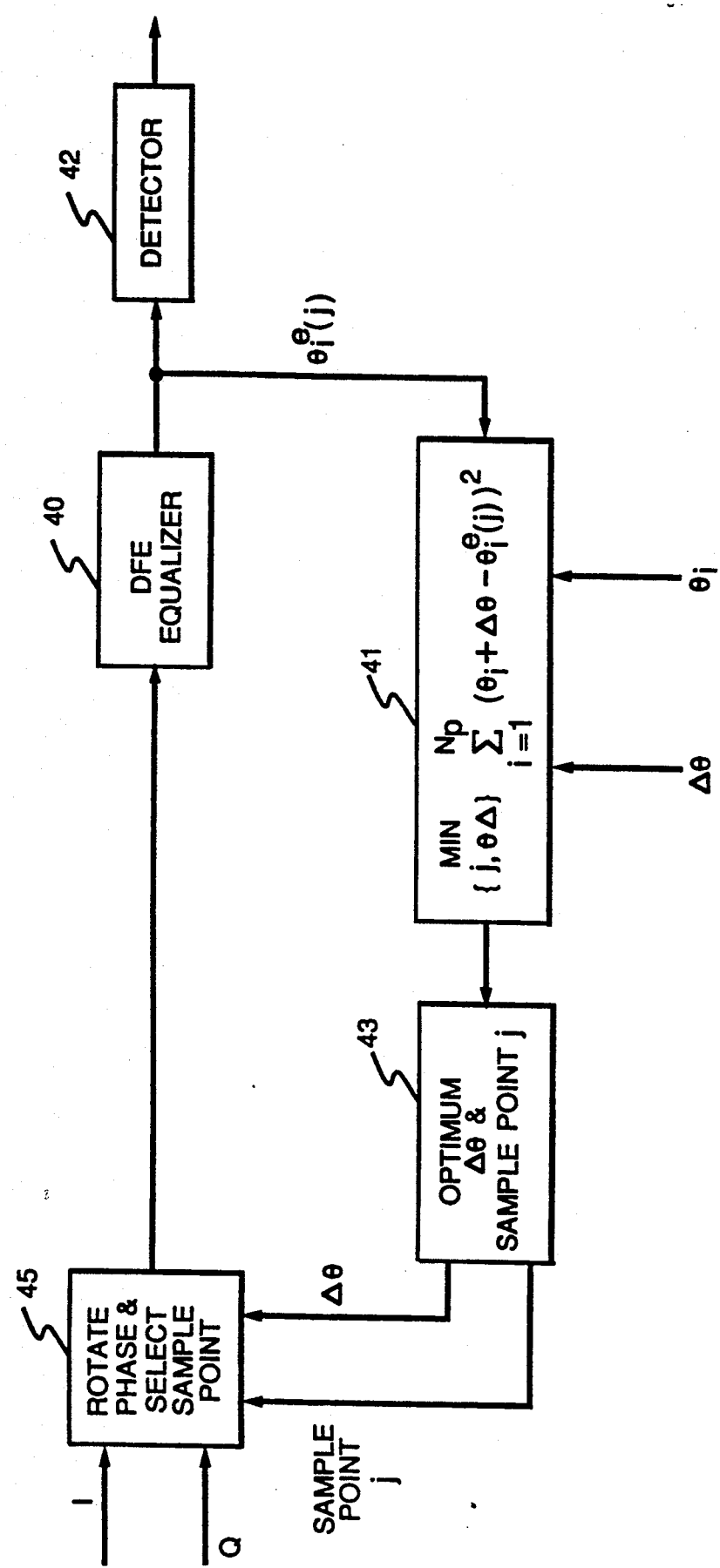
FIG. 5 is a diagrammatic illustration of DFE operation in symbol timing acquisition mode.

The principle of the symbol timing and carrier frequency offset estimation technique is as follows. The A/D converter and sorter 28 (FIG. 2) produces a stream of (I,Q) samples corresponding to each successive symbol. These (I,Q) samples may be filtered using the square root raised cosine filter 29 that is matched to the transmit filter. Symbol timing is established by finding the sample which minimizes the sum of the squared error between the decoded symbol and a corresponding preamble symbol, the sum being accumulated over the entire preamble sequence. Alternatively, the symbol timing can be established by finding the sample which minimizes the sum of the squared error between the phase of the decoded symbol and a corresponding phase of a preamble symbol. This alternative embodiment is described herein. Once this sample is identified, and since the number of samples per symbol is known, the symbol timing may be obtained by use of a simple counter. Similarly, the carrier frequency offset is determined by applying a set of fixed carrier phase correction (rotation) values to each sample and determining which of these values minimizes the symbol decoding error. These two techniques for symbol timing and carrier frequency offset estimation are integrated into a single technique that is illustrated in FIG. 5 and described below. This technique employs the synchronizing word symbols, the preamble 3 of FIG. 1, as a reference to estimate both the optimum sample point and the carrier phase rotation that minimizes the squared error between the reference sequence and the corresponding detected sequence. This technique may also be used to "fine tune" the frame/slot synchronization.

As shown in FIG. 1, each TDMA time slot 2 of data has a unique synchronization word or preamble 3 that is known to the receiver. The TDMA frame of data is acquired by establishing frame and time slot synchronization. This is accomplished with technique that establishes a coarse frame/slot position that is accurate to within $N_1$ samples of the correct position, where $N_1 < N_s/2$ and $N_s$ is the number of samples per symbol. Having established frame/slot synchronization, $N_2(N_2 > N_1)$ data samples on either side of the established slot sync position are buffered. Each buffered sample is then sequentially used as a starting point, in the equation given below, for locating the optimum sampling instant and carrier phase rotation. This technique can be considered as a two-dimensional search procedure that seeks to minimize an objective function with respect to symbol timing and carrier frequency offset. The objective function is defined to be the squared distance between the phase angles of the synchronizing word and the corresponding phase angles obtained in the system of FIG. 5 at the DFE equalizer or decoder 40 output. This process can be mathematically expressed as:

$$\min_{\{j,\Delta\theta\}} \sum_{i=1}^{N_p} (\theta_i + \Delta\theta - \theta_i^e(j))^2 \qquad (13)$$

where,
j is the sampling instant
$\theta_i$ is the phase angle of the symbol of the preamble
$\Delta\theta$ is the phase rotation given to the received signal
$\theta_i^e(j)$ is the decoded phase angle corresponding to the $i^{th}$ symbol at the jth sampling instant, and
$N_p$ is the number of symbols in the preamble The technique described by Equation 13 produces an estimate of the phase rotation per symbol. The phase rotation per sample is obtained by dividing $\Delta\theta$ by $N_s$. Either absolute phase angles of symbols or differential phase angles between successive symbols may be used in Equation 13. Using differential phase angles, the summation in Equation 13 goes from $i=2$ to $N_P$.

The technique embodied in Equation 13 is performed by functional block 41 which receives as its input signal the output signal $\theta_i^e(j)$ from DFE 40 of the circuitry depicted in block diagram form in FIG. 5. Because the carrier frequency offset may be expected to remain relatively constant over several hundred TDMA frames 1 (FIG. 1), the process described by Equation 13 may be modified as follows. First, the two-dimensional search for the optimum sample timing (j) and phase rotation ($\Delta\theta$) at start up or at hand-off is performed at functional block 43 on the output signal of functional block 41. The method subsequently compensates for the phase rotation and thereafter searches for only the optimum sampling instant (j), as indicated at functional block 45, at the start of each time slot 2 (FIG. 1).

Figure 6:
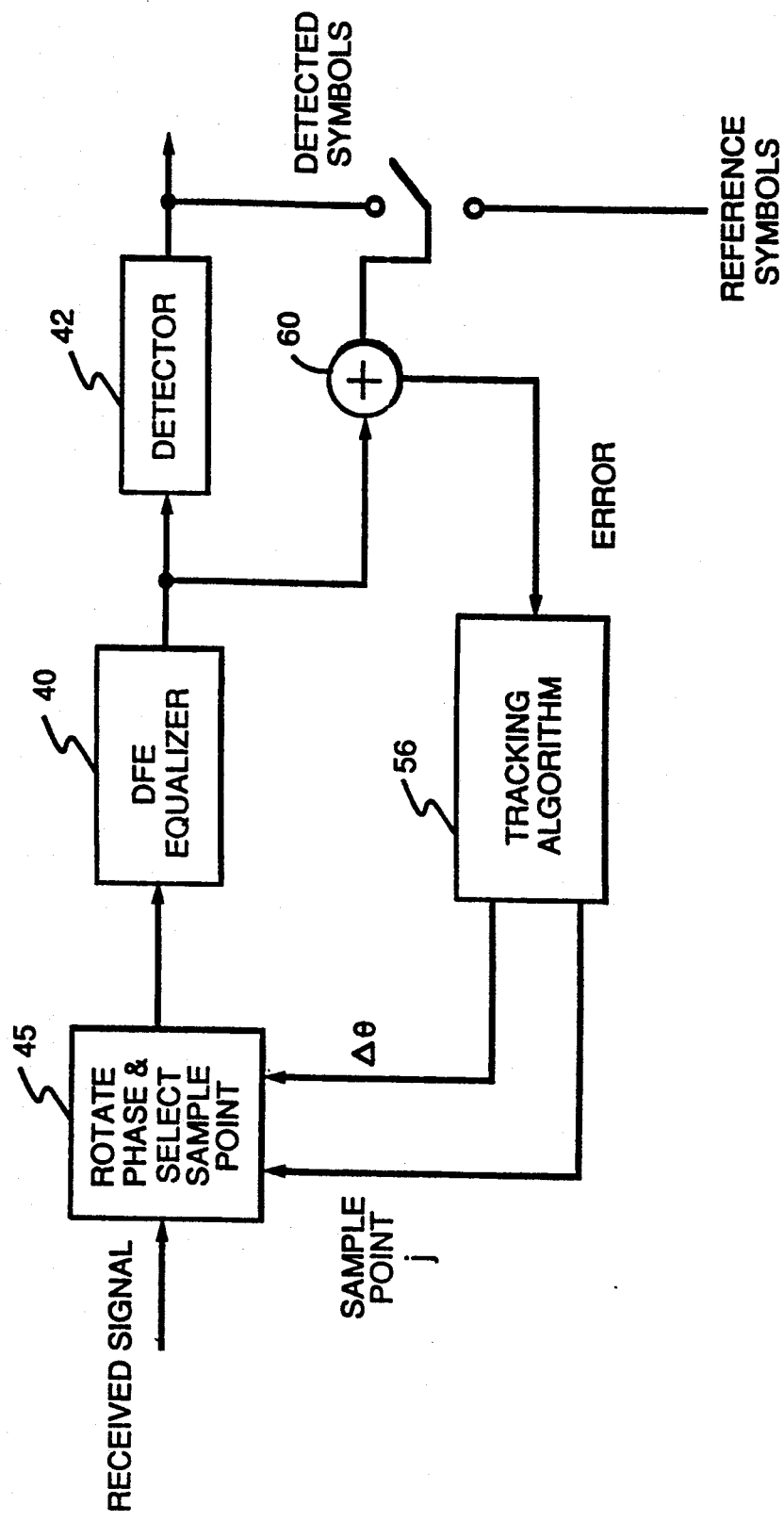
FIG. 6 is a block diagram illustrating DFE operation in symbol timing tracking mode.

For the case in which fading is very rapid, it is likely that the optimum sampling instant may change during time slot 2 (FIG. 1). This is avoided by continuously adapting the sampling phase using equalizer 40 in a closed loop arrangement as shown in FIG. 6. This technique operates in a decision directed mode.

An implementation of DFE 40 as described herein was tested using a simulated mobile radio channel. In the BER simulations a sample size of $10^{k+2}$ was used to estimate an error probability of $10^{-k}$. This sample size produces a 99% confidence interval of $[1.29P_e, 0.77P_e]$, where $P_e$ is the estimated probability of error. The BER simulations were conducted at baseband with both two ray and three ray models and a carrier frequency of 900 MHz. Perfect frame, slot and symbol synchronization was assumed and perfect carrier frequency was assumed at the demodulator. A Nyquist square root raised cosine filter, matched to the transmit filter (pulse shaper 22 of FIG. 2), was used at the receiver.

The DFE was operated as follows. At the start of a slot 2 (FIG. 1), a 13 symbol training period was employed. This was followed by data detection. The DFE continuously updated the filter coefficients during the 6.67 ms time slot.

An optimal size, or number of taps, of the DFE was found to be a trade-off between complexity and performance. The complexity increases with the total number of taps while the number of taps determines the range of delay spread over which the BER will be acceptable. A (4,3)DFE was found to perform well. However, for a BER threshold of 3% and for equalization of a delay spread interval of up to 60 microseconds a (2,3)DFE was found to provide an adequate compromise between performance and complexity. For delay spreads of less than 40 microseconds, and greater than approximately 10 microseconds, the use of a (2,3) fractionally spaced DFE was found to be more suitable. A (2,3)DFE is one having two feed-forward taps 50' and three feedback taps 52' while a (4,3)DFE is one having four feed-forward taps 50' and three feedback taps 52'.

It was observed that the DFE performance peaked for a delay of one symbol period. This is to be expected for a (2,3)DFE. For delay spreads of less than 10 microseconds the performance of the DFE was found to degrade. For delay spreads of less than a third of a symbol duration, or approximately 14 microseconds, it was found to be advantageous to switch DFE 40 out of demodulator 30 (FIG. 3) altogether or else to reduce the number of equalizer taps 50', 52' (FIG. 4). The criterion for closing switch 40a of FIG. 3 can be derived by delay spread estimator 62 from channel state information. This channel state information can be obtained from monitoring a mean squared error (MSE) expressed by Equation 10, from the tap (coefficient) values, signal-to-noise ratio (SNR) monitored through AGC control loop voltage (functional block 26 of FIG. 2), and/or speech decoder 16 (FIG. 2) cyclic redundancy check sums.

As opposed to completely switching DFE 40 out of demodulator circuit 30 of FIG. 3, the size of equalizer 40 may be modified by delay spread estimator 62 of FIG. 4 applying a DFE SIZE signal to the Complex Fast-Kalman Algorithm of function block 56. Assertion of this DFE SIZE signal causes a reduction in the number of taps from, for example, (2,3) to, for example, (1,2).

At higher vehicle speeds a loss in performance due to faster channel variations was observed. At 50 mph, slot 2 (FIG. 1) can be expected, on average, to experience a fade condition. In such a rapid fading environment the Complex Fast-Kalman Algorithm implemented in functional block 56 of FIG. 6 was found to function well. When experiencing fast fading it is desirable to reduce the time over which channel tracking is required. This may be accomplished by placing the training sequence in the middle of the slot, as a midamble, as opposed to placing the training sequence at the beginning as a preamble. Using this technique, DFE 40 decodes data starting from the middle of the slot and subsequently moves outward in both directions. The use of a midamble was found to result in a performance improvement over the use of a preamble for a time slot having a duration of 6.67 ms. However, this technique requires buffering the data of the entire slot 2 of FIG. 1. Another technique employs the preamble 3 of FIG. 1 for training the DFE and then partially "re-trains" the DFE in the middle of the slot using a known sequence of symbols, such as the 12-bit Coded Digital Verification Color Code (DVCC) word 4 illustrated in FIG. 1.

In summary, a DFE for a digital cellular mobile radio channel employs an enhanced complex version of the Fast-Kalman Adaptation algorithm to rapidly track channel variations. A sensitivity to sample timing jitter may be reduced by providing the DFE with fractionally spaced feed-forward taps. Deficiencies inherent in the use of a reduced precision implementation of the algorithm are overcome by the addition of a dither signal to sets of operations in the algorithm. The dither signal comprises an appropriately selected Gaussian random variable. A (4,3) fractionally spaced DFE was found to perform well over a wide range of delay spreads. For delay spreads of approximately one third of a symbol duration and less, a degradation in BER results from use of the (2,3) DFE and also the (4,3) fractionally spaced DFE. This degradation is avoided by switching the DFE out of the circuit or by reducing the number of taps of the DFE. For delay spreads of less than 40 microseconds and greater than approximately 10 microseconds, the use of a (2,3) fractionally spaced DFE was found to offer an adequate compromise between complexity and performance.

While the invention has been particularly shown and described with respect to a preferred embodiment thereof, it will be understood by those skilled in the art that changes in form and details may be made therein without departing from the scope and spirit of the invention.

What is claimed is:

1. Apparatus for demodulating a Time Division Multiple Access (TDMA) signal having a time slot comprised of a plurality of symbols including at least one sequence of synchronizing symbols and a plurality of data symbols, comprising:
    receiver means for receiving the signal over a channel;
    adaptive filter means for adaptively filtering the received signal to minimize inter-symbol interference due to channel multipath propagation, the adaptive filter means having an input coupled to an output of the receiving means and comprising a decision feedback equalizer having a plurality (n) of feed-forward taps and a plurality (m) of feedback taps;
    a plurality of multiplying nodes, each of the taps, respectively, being coupled to one of said nodes, respectively, for modifying the output signal on each of the taps, respectively, in accordance with a value of an associated coefficient;
    coefficient generating means coupled to an output of the adaptive filter means for recursively generating the coefficients for each of said nodes in accordance with a Complex Fast-Kalman Algorithm;
    circuit means for initially adapting the adaptive filter means to the sequence of synchronizing symbols, said circuit means including means for switchably coupling an input of the (m) plurality of feedback taps to a time slot midamble of synchronizing symbols; and
    means for buffering all of the symbols of the time slot.

2. Apparatus for demodulating a Time Division Multiple Access (TDMA) signal having a time slot comprised of a plurality of symbols including at least one sequence of synchronizing symbols and a plurality of data symbols, comprising:
    receiver means for receiving the signal over a channel;
    adaptive filter means for adaptively filtering the received signal to minimize inter-symbol interference due to channel multipath propagation, the adaptive filter means having an input coupled to an output of the receiving means and comprising a decision feedback equalizer having a plurality (n) of feed-forward taps and a plurality (m) of feedback taps;
    a plurality of multiplying nodes, each of the taps, respectively, being coupled to one of said nodes, respectively, for modifying the output signal on each of the taps, respectively, in accordance with a value of an associated coefficient;
    coefficient generating means coupled to an output of the adaptive filter means for recursively generating the coefficients for each of said nodes in accordance with a Complex Fast-Kalman Algorithm; and
    means responsive to duration of a propagation delay shorter than a threshold value, for causing the received signal to bypass the adaptive filter means.

3. Apparatus as set forth in claim 2 wherein the threshold value is approximately one third of the duration of a symbol.

4. Apparatus for demodulating a Time Division Multiple Access (TDMA) signal having a time slot comprised of a plurality of symbols including at least one sequence of synchronizing symbols and a plurality of data symbols, comprising:
    receiver means for receiving the signal over a channel; adaptive filter means for adaptively filtering the received signal to minimize inter-symbol interference due to channel multipath propagation, the adaptive filter means having an input coupled to an output of the receiving means and comprising a decision feedback equalizer having a plurality (n) of feed-forward taps and a plurality (m) of feedback taps;
    a plurality of multiplying nodes, each of the taps, respectively, being coupled to one of said nodes, respectively, for modifying the output signal on each of the taps, respectively, in accordance with a value of an associated coefficient;
    coefficient generating means coupled to an output of the adaptive filter means for recursively generating the coefficients for each of said nodes in accordance with a Complex Fast-Kalman Algorithm; and
    means responsive to duration of a propagation delay shorter than a threshold value, for varying the number of taps of the adaptive filter means.

5. Apparatus as set forth in claim 4 wherein the threshold value is approximately one third of the duration of a symbol.

6. Apparatus for demodulating a Time Division Multiple Access (TDMA) signal having a time slot comprised of a plurality of symbols including at least one sequence of synchronizing symbols and a plurality of data symbols, comprising:

receiver means for receiving the signal over a channel;

adaptive filter means for adaptively filtering the received signal to minimize inter-symbol interference due to channel multipath propagation, the adaptive filter means having an input coupled to an output of the receiving means and comprising a decision feedback equalizer having a plurality (n) of feed-forward taps and a plurality (m) of feedback taps;

a plurality of multiplying nodes, each of the taps, respectively, being coupled to one of said nodes, respectively, for modifying the output signal on each of the taps, respectively, in accordance with a value of an associated coefficient;

coefficient generating means coupled to an output of the adaptive filter means for recursively generating the coefficients for each of said nodes in accordance with a Complex Fast-Kalman Algorithm; and means responsive to the receiver means for estimating symbol timing and compensating for a phase rotation of the received signal in accordance with an expression:

$$\min_{\{j, \Delta\theta\}} \sum_{i=1}^{Np} (\theta_i + \Delta\theta - \theta_i^r(j))^2$$

where, j = sampling instant, $\theta_i$ = phase angle of the $i^{th}$ symbol of the preamble, $\Delta\theta$ = phase rotation given to received signal, and $\theta_i^r(j)$ = decoded phase angle corresponding to the $i^{th}$ symbol at the $j^{th}$ sampling instant.

7. Apparatus for demodulating a Time Division Multiple Access (TDMA) signal having a time slot comprised of a plurality of symbols including at least one sequence of synchronizing symbols and a plurality of data symbols, comprising:

receiver means for receiving the signal over a channel;

adaptive filter means for adaptively filtering the received signal to minimize inter-symbol interference due to channel multipath propagation, the adaptive filter means having an input coupled to an output of the receiving means and comprising a decision feedback equalizer having a plurality (n) of feed-forward taps and a plurality (m) of feedback taps;

a plurality of multiplying nodes, each of the taps, respectively, being coupled to one of said nodes, respectively, for modifying the output signal on each of the taps, respectively, in accordance with a value of an associated coefficient; and coefficient generating means coupled to an output of the adaptive filter means for recursively generating the coefficients for each of said nodes in accordance with a Complex Fast-Kalman Algorithm;

said coefficient generating means including means for adding a dither signal to arithmetic operations performed thereby, the dither signal being expressive of a Gaussian random variable.

8. A method for demodulating a Time Division Multiple Access (TDMA) signal having a time slot comprised of a plurality of symbols including a least one sequence of synchronizing symbols and a plurality of data symbols, comprising the steps of:

receiving the signal over a channel;

processing the received signal with an adaptive filter means to minimize inter-symbol interference due to channel multipath propagation, the adaptive filter means comprising a decision feedback equalizer having a plurality (n) of feed-forward taps and a plurality (m) of feedback taps, the step of processing the received signal including the steps of buffering the received symbols, and adapting the adaptive filter means to a sequence of time slot synchronizing symbols received after the time slot has begun; and recursively generating coefficients in accordance with a Complex Fast-Kalman Adaptation Algorithm to modify the output signal on each of the taps, respectively, in accordance with a value of an associated coefficient.

9. A method for demodulating a Time Division Multiple Access (TDMA) signal having a time slot comprised of a plurality of symbols including at least one sequence of synchronizing symbols and a plurality of data symbols, comprising the steps of:

receiving the signal over a channel;

processing the received signal with an adaptive filter means to minimize inter-symbol interference due to channel multipath propagation, the adaptive filter means comprising a decision feedback equalizer having a plurality (n) of feed-forward taps and a plurality (m) of feedback taps;

recursively generating coefficients in accordance with a Complex Fast-Kalman Adaptation Algorithm to modify the output signal on each of the taps, respectively, in accordance with a value of an associated coefficient;

comparing duration of a propagation delay to a threshold value; and causing the received signal to bypass the adaptive filter means when the propagation delay is equal to or less than the threshold value.

10. A method for demodulating a Time Division Multiple Access (TDMA) signal having a time slot comprised of a plurality of symbols including at least one sequence of synchronizing symbols and a plurality of data symbols, comprising the steps of:

receiving the signal over a channel;

processing the received signal with an adaptive filter means to minimize inter-symbol interference due to channel multipath propagation, the adaptive filter means comprising a decision feedback equalizer having a plurality (n) of feed-forward taps and a plurality (m) of feedback taps; recursively generating coefficients in accordance with a Complex Fast-Kalman Adaptation Algorithm to modify the output signal on each of the taps, respectively, in accordance with a value of an associated coefficient;

comparing duration of a propagation delay to a threshold value; and reducing the number of taps of the adaptive filter means when the propagation delay is equal to or less than the threshold value.

11. A method for demodulating a Time Division Multiple Access (TDMA) signal having a time slot comprised of a plurality of symbols including at least one sequence of synchronizing symbols and a plurality of data symbols, comprising the steps of:

receiving the signal over a channel;

processing the received signal with an adaptive filter means to minimize inter-symbol interference due to channel multipath propagation, the adaptive filter means comprising a decision feedback equalizer having a plurality (n) of feed-forward taps and a plurality (m) of feedback taps the step of processing the received signal including the step of estimating symbol timing and compensating for a phase rotation of the received signal in accordance with an expression given by:

$$\min_{\{j, \Delta\theta\}} \sum_{i=1}^{Np} (\theta_i + \Delta\theta - \theta_i^e(j))^2$$

where, $j$ = sampling instant, $\theta_i$ = phase angle of the $i^{th}$ symbol of the preamble, $\Delta\theta$ = phase rotation given to the received signal, and $\theta_i^e(j)$ = decoded phase angle corresponding to the $i^{th}$ symbol at the $j^{th}$ sampling instant; and recursively generating coefficients in accordance with a Complex Fast-Kalman Adaptation Algorithm to modify the output signal on each of the taps, respectively, in accordance with a value of an associated coefficient.

12. A method for demodulating a Time Division Multiple Access (TDMA) signal having a time slot comprised of a plurality of symbols including at least one sequence of synchronizing symbols and a plurality of data symbols, comprising the steps of:

receiving the signal over a channel;

processing the received signal with an adaptive filter means to minimize inter-symbol interference due to channel multipath propagation, the adaptive filter means comprising a decision feedback equalizer having a plurality (n) of feed-forward taps and a plurality (m) of feedback taps; and recursively generating coefficients in accordance with a Complex Fast-Kalman Adaptation Algorithm to modify the output signal on each of the taps, respectively, in accordance with a value of an associated coefficient, the step of recursively generating coefficients including the step of adding a dither signal to arithmetic operations thereof, the dither signal being expressive of a Gaussian random variable.

* * * * *